United States Patent [19]

Middendorf et al.

[11] 4,169,287
[45] Sep. 25, 1979

[54] PRINTING INTEGRATOR

[75] Inventors: Lyle R. Middendorf; William W. Biggs, both of Lincoln, Nebr.

[73] Assignee: Lambda Instruments Company, Lincoln, Nebr.

[21] Appl. No.: 803,576

[22] Filed: Jun. 6, 1977

[51] Int. Cl.² .................. G06G 7/18; G06J 1/00; H03K 13/20
[52] U.S. Cl. ................. 364/835; 307/271; 328/150; 340/347 NT; 364/519
[58] Field of Search .............. 364/835, 519; 340/347 NT; 307/271, 350, 214; 328/150

[56] References Cited

U.S. PATENT DOCUMENTS

| | | | |
|---|---|---|---|
| 3,183,366 | 5/1965 | Brode | 307/214 |
| 3,230,358 | 1/1966 | Davis et al. | 364/835 |
| 3,389,271 | 6/1968 | Gray | 307/271 |
| 3,504,267 | 3/1970 | James et al. | 307/271 |
| 3,517,339 | 6/1970 | Hubbard et al. | 307/271 |
| 3,768,009 | 10/1973 | Dorey et al. | 340/347 NT |
| 3,778,794 | 12/1973 | Szabo et al. | 307/271 |
| 3,789,202 | 1/1974 | Yamanaka | 340/347 NT |
| 3,842,416 | 10/1974 | Eto | 364/835 |
| 3,942,110 | 3/1976 | Milkovic | 307/271 |
| 3,998,088 | 12/1976 | Kazangey | 364/835 |
| 4,088,906 | 5/1978 | Hüllwegen | 328/150 |
| 4,118,696 | 10/1978 | Warther | 340/347 NT |

Primary Examiner—Felix D. Gruber
Attorney, Agent, or Firm—Vincent L. Carney

[57] ABSTRACT

To provide a printout corresponding to the integral of the current or voltage from any of several different instruments, a printing integrator includes a voltage-to-frequency converter which receives current or voltage through a replaceable buffer amplifier and provides pulses to a counter at a rate proportional to the amplitude of the input current or voltage. The output of the counter is printed in rows along with the time of printing and an indication of the state of the battery.

To generate pulses at a rate proportional to an input signal, a charge is periodically supplied to a feedback capacitor of an operational amplifier from a storage capacitor in the voltage-to-frequency converter, and an input current derived from the signal decreases the charge in the feedback capacitor until the output potential of the operational amplifier drops below a level set on a comparator, thus generating a pulse and initiating another discharge from the storage capacitor into the feedback capacitor.

25 Claims, 7 Drawing Figures

PRINTING INTEGRATOR

This invention relates to printing integrators and more particularly to printing integrators including a voltage-to-frequency converter.

One class of printing integrator includes a voltage-to-frequency converter, a counter and a printer. The voltage-to-frequency converter supplies pulses to the counter at a rate proportional to the amplitude of the input current or voltage and the counter counts the pulses before applying them to a printer for printing a number related to the integral of the input current or voltage. To sample the input signal, the voltage-to-frequency converter includes a sample-and-hold circuit which stores charge in a capacitor until a certain amplitude is reached and then discharges the capacitor by adding charge of the opposite polarity or by shortening the capacitor.

In the prior art printing integrator of this class, the sample-and-hold circuit interrupts the input signal when the capacitor is discharged. This type of printing integrator has several disadvantages such as: (1) inaccuracies are created by loss of some signals during the switching operations inherent in a sample-and-hold device; (2) inaccuracies are caused in portable units when the battery potential falls; (3) the readout is not well calibrated for increments in time; (4) the switching gates inherent in the sample-and-hold circuits cause errors from transient injection and leakage currents; and (5) precision of frequency conversion is low because constant current sources are required and they are frequently imprecise.

Accordingly, it is an object of this invention to provide a novel printing integrator.

It is a further object of the invention to provide a novel voltage-to-frequency converter.

It is a still further object of the invention to provide a printing integrator which operates with great accuracy.

It is a still further object of the invention to provide a printing integrator in which the printout indicates the condition of the battery and the time increments of the measurements.

It is a still further object of the invention to provide a voltage-to-frequency converter in which the charge is compared to the incoming current or potential.

It is a still further object of the invention to provide a voltage to frequency converter which is not susceptible to jamming or locking due to large over-range signal surges.

It is a still further object of the invention to provide a voltage-to-frequency converter in which the precision is primarily controlled by parameters of lumped impedances such as resistors and capacitors and is not dependent on constant current sources.

In accordance with the above and further objects of the invention, a printing integrator includes a voltage-to-frequency converter, a counter and a printer. The voltage-to-frequency converter is adapted to be connected to an instrument, and has for this purpose, a number of different buffer amplifiers, a selected one of which may be used to accommodate different input signal ranges and adjust to current or voltage input signals.

To generate pulses at a rate proportional to the amplitude of the voltage or current from the instrument, the voltage-to-frequency converter has an operational amplifier with a feedback capacitor forming an integrator. The output of the operational amplifier is connected to one input of the comparator and the other input is connected to a reference potential so that when the potential at the output of the operational amplifier drops below a certain level, the comparator provides a negative pulse. The pulse from the comparator triggers a monostable multivibrator to provide an output pulse.

To cause continuous generation of pulses, each output pulse of the monostable multivibrator causes a charge stored in another capacitor to be dumped into the feedback capacitor recharging it with a polarity opposite to that of the charge transmitted to the capacitor by the input signal from the instrument. Consequently, a standard amount of charge established by a reference potential and a reference capacitor is supplied to the feedback capacitor during each output pulse. When the input current determined by the input signal depletes a sufficient amount of this charge, another pulse is generated and this again recharges the capacitor, resulting in a series of output pulses proportional to the input signal.

To calculate and print the integral of the current, the pulses from the voltage-to-frequency converter are counted by a counter. The counter has two sections, the first of which receives pulses from the voltage-to-frequency converter and applies them to the second from a selected output so as to apply a dividing factor to the input pulses. At the end of each of a preselected time increment, the second counter is read in parallel to a printer which prints its values. The increments at which it is printed are settable so that integration is carried out across a definite period of time. When the printout occurs, the time in minutes, hours and days is printed in the same row and if the battery is weak, a "B" is printed in the same row.

The printer includes a single print cylinder and a plurality of anvils that press the paper against the numbers or letters on the cylinder. The paper is pressed against the cylinder when the selected number or letter is aligned with the hammer to print that selected number or letter. It has been found that with the parallel printing of values and other indications in a single row for each time period, exceptional economy is achieved by the reduction of buffer interfacing to the printer while maintaining good reliability of the printing integrator.

As can be understood from the above description, the printing integrator of this invention has several advantages, such as: (1) it is exceptionally precise; (2) it provides an indication in a portable unit when the battery is weak; (3) it provides a convenient indication of time; and (4) it is economical. The high precision is possible because, in the operation of the voltage-to-frequency converter, a standard amount of charge is stored in a capacitor and is balanced against the incoming current to determine the frequency of the voltage-to-frequency converter. Consequently, the parameters are resistors and capacitors all of which can be accurately controlled. The current determined by the input signal always flows into the capacitor and is not alternately connected and disconnected, thus preventing loss of current at the time of disconnection.

The above noted and other features of the invention will be better understood from the following detailed description when considered with reference to the accompanying drawings in which.

Figure 1:
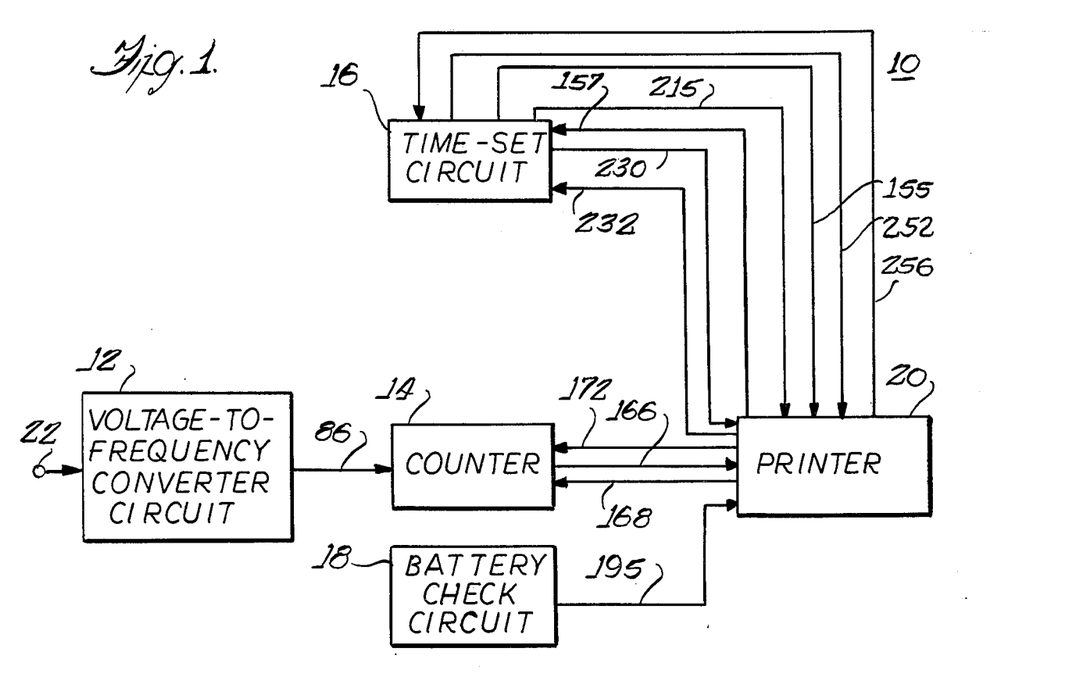
FIG. 1 is a block diagram of a printing integrator including the invention.

In FIG. 1, there is shown a block diagram of a printing integrator 10, having a charge-controlled voltage-to-frequency converter circuit 12, a counter 14, a time-set circuit 16, a battery check circuit 18 and a printer 20. The voltage-to-frequency converter circuit 12 receives an input signal which is to be integrated on input terminal 22, and generates pulses proportional, in repetition rate, to the amplitude of the signal received on input terminal 22, applying those pulses to the input of the counter 14.

The counter 14 integrates the signal represented by the pulses by counting the pulses and applies the integrated signal to the printer 20 for printout. The printer 20 is also connected to (1) the time-set circuit 16 which enables it to print the time of each printing; and (2) the battery check circuit 18 which enables it to print an indicia of the condition of the battery which is supplying power to the printing integrator 10.

The time-set circuit 16 includes a print-interval switch and a start-reset-increment switch (not shown in FIG. 1). The start-reset-increment switch: (1) resets a time register (not shown in FIG. 1) to 00 days, 00 hours and 00 minutes when moved from the start position to the reset position; (2) increases the time recorded in the time register by one increment, which in the preferred embodiment is one hour, each time it is moved from the reset to the increment position; and (3) connects a clock generator to the time register when in the start position to increment this register in synchronism with real time. The print-interval switch selects the integration period.

The printer 20 includes a three-position print-inhibit, print-enable, paper-advance switch that: (1) enables periodic automatic printout when in the print-enable position; (2) inhibits printout when in the print-inhibit position; and (3) causes a manual printout when moved either from the print-enable position to the print-inhibit position or from the print-inhibit position to the print-enable position. By changing the position of this switch, this manual-initiated printout also causes the letter "M" to be printed but does not reset the memory storing the integral of the signal. This allows monitoring of the progress of an integration during the integration.

The counter 14 includes a divider switch which is set to divide the count by a selected factor to prevent overflow.

Before operating the printing integrator 10: (1) the starting time is set using the time-set circuit 16; (2) automatic or manual operation is selected; (3) a scale factor is set on the counter 14; and (4) an instrument is connected to the input terminal 22 to provide a signal to the charge-controlled voltage-to-frequency converter circuit 12 for measurement, integrating and printing.

The input terminal 22 is intended for interconnection with a broad range of both current and voltage output instruments. For example, the output of a radiometer may be applied to integrate this output over selected periods of time indicating the radiant energy received during that time period. Many other types of sensors may be connected to the input terminal 22 to provide an output for integration.

In automatic operation, the signal applied to input terminal 22 is integrated. The integrated signal is printed at the end of the selected periods of time together with: (1) the time of the printout; and (2) the scale factor by which the output is divided. In manual operation, an indication of manual operation is printed and the absence of this indication shows that it is an automatic operation. To be sure of accuracy, when the battery potential becomes low, a signal is also printed.

The signal from the instrument connected to input terminal 22 is applied to the charge-controlled voltage-to-frequency converter circuit 12 which generates digital pulses of a fixed amplitude and a repetition rate proportional to the amplitude of the signal applied to the input terminal 22. The voltage-to-frequency converter circuit 12 is relatively free from errors caused by variations in the temperature and impedance and the like. This is accomplished by comparing the input signal with a charge generated in a capacitor by a controlled voltage source.

To integrate the signals applied to input terminal 22, the counter 14 receives the pulses from the voltage-to-frequency converter circuit 12. This counter counts the pulses, which vary in repetition rate with the amplitude of the signal applied to input terminal 22. Reset signals are applied at the fixed periods of time set in the printing integrator 10 and, the counter 14 generates a count proportional to the integral of the input applied to terminal 22 between the reset signals.

The printer 20 receives signals indicating the day, hour and minute of each printout, the scale factor that the signal from the counter 14 is divided by, and the number of counts in the counter 14, and prints them at the fixed increments across which the signal from input terminal 22 is integrated. It also prints the letter "B" if the battery check circuit 18 indicates that the battery potential has fallen below a predetermined level and indicates whenever a manual printout is obtained instead of the automatic printout. The printing of the letter "B" insures accurate results by enabling the battery to be changed before the drop in battery potential causes errors in the integrated signal.

Figure 2:
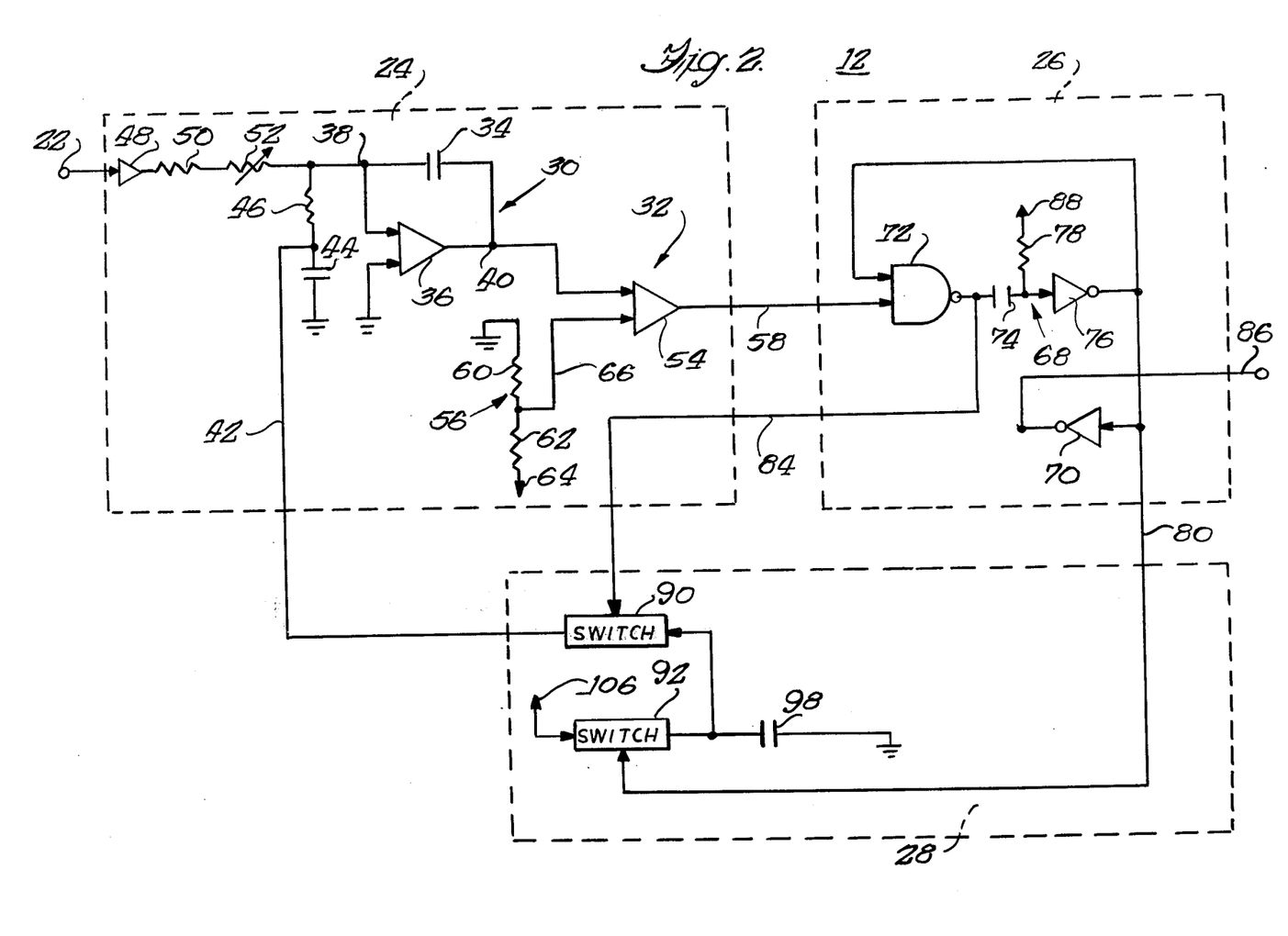
FIG. 2 is a schematic circuit diagram of a voltage-to-frequency converter which forms a portion of the printing integrator of FIG. 1.

In FIG. 2, there is shown a schematic circuit diagram of the voltage-to-frequency converter circuit 12 having an input comparing circuit 24, an output-signal and internal-timing circuit 26 and a standard charge-providing circuit 28.

The input-comparing circuit 24: (1) is connected to input terminal 22 to receive an input current or voltage; (2) is connected to the standard charge-providing circuit 28 through a conductor 42 from which it receives a standard charge and compares it to the charge accumulated from the input signal; and (3) is connected to the output-signal and internal-timing circuit 26 through a conductor 58 to which it provides an output signal when the standard charge is reduced by the input signal to a predetermined level.

The output-signal and internal-timing circuit 26 receives the output signal from the input-comparing circuit 24 indicating that the standard charge has been reduced to a predetermined level and provides an output pulse to conductor 86 and a timing pulse to the standard charge-providing circuit 28, which pulse controls the timing of the charge-controlled voltage-to-frequency converter circuit 12.

The standard charge-providing circuit 28 is connected to the output-signal and the internal-timing circuit 26 to receive the internal timing pulse and is electrically connected to the input-comparing circuit 24 to replenish stored charge upon receiving the internal timing signal from the output-signal and internal-timing circuit 26.

To compare the input current applied to input terminal 22 with a reference, the input-comparing circuit 24 includes a charge-storage circuit 30 and a comparator circuit 32.

To store charge, the charge-storing circuit 30 includes a capacitor 34 and an operational amplifier 36. A first terminal 38 is electrically connected to the first plate of the capacitor 34 and to one input of the operational amplifier 36 and a second terminal 40 is electrically connected to the second plate of the capacitor 34 and to the output of the operational amplifier 36. With this arrangement, the capacitor 34 and the operational amplifier 36 form an integrator which retains storage on the capacitor 34 and provides an output signal which is the integral of an input current applied to the terminal 38.

To store a reference charge on the capacitor 34, the standard charge-providing circuit 28 is electrically connected through a conductor 42 to: (1) ground through a capacitor 44; and (2) the terminal 38 through a resistor 46. With these connections, the standard charge-providing circuit 28 applies a fixed standard amount of charge to the capacitor 34 by transmitting a current comprising that charge through conductor 42, a portion of which charge initially charges capacitor 44 and a portion of which flows to capacitor 34, with the portion stored on capacitor 44 eventually flowing to capacitor 34. Capacitor 44 may be omitted in some circuits. In other circuits a capacitor may be necessary if amplifier 36 has instability at its input, such as instability caused by 180 degrees phase under some circumstances.

To apply the input signal to capacitor 34, input terminal 22 is electrically connected to terminal 38 through a buffer amplifier 48, a first resistor 50, and an adjustable resistor 52, in series in the order named. With this arrangement, the signal at input terminal 22 causes current to continuously flow to the operational amplifier 36 and capacitor 34.

The buffer amplifier 48: (1) adjusts the input signal level to the voltage-to-frequency converter to enable a wider range of input signals to be measured; and (2) converts the current from some instruments into voltage to permit use in measuring both current and voltage signals. One reason that it is desirable to include buffer amplifiers is because the output from the circuit 28 is between a fixed range of voltages, which in the preferred embodiment has a lower limit of a negative 2.7 volts. The use of buffer amplifiers increases the ability of the instrument to handle signals without redesigning the circuit 28 and the remainder of the circuits to handle different voltages.

In the preferred embodiment, the buffer amplifier 48 is mounted on a card. A series of interchangeable amplifiers are provided, which match different instruments so that a wide range of instruments with differing outputs may be connected to the printing integrator 10.

To compare the input signal to a reference, the comparator circuit 32 includes a comparator 54 and a reference circuit 56. The comparator 54 has its positive or noninverting terminal connected to terminal 40 to receive the output from the operational amplifier 36, which is the integral of the applied signal thereto and has its output electrically connected to the output-signal and internal-timing circuit 26 through a conductor 58. The reference circuit 56 includes a first resistor 60, second resistor 62, and a reference potential 64. The negative or inverting terminal of the comparator 54 is electrically connected to a conductor 66 to one end of the resistor 60 and to one end of the resistor 62, with the other end of the resistor 60 being grounded and the other end of the resistor 62 being connected to the reference potential 64, which is a source of negative 2.7 volts.

With this connection, the negative or inverting terminal of the comparator 54 is held at a fixed potential by the reference circuit 56 so that, as the input current caused by the input signal from input terminal 22 diminishes the charge stored on capacitor 34 below a predetermined value, the positive terminal of the comparator 54 shifts from a potential higher than the potential on conductor 66 to a potential lower than that of conductor 66. When the charge falls below that predetermined value, the output conductor 58 from the comparator 54 goes negative. When the charge on capacitor 34 is replenished, the potential on the positive terminal of comparator 54 increases and causes the output conductor 58 to go positive.

When the comparator 54 provides a negative signal, the charge on capacitor 34 is replenished in a manner to be described hereinafter so that a series of output pulses is provided by the comparator 54 at a frequency proportional to the rate at which the standard charge on capacitor 34 is diminished by the input signal on input terminal 22. To provide internal-timing signals to the standard charge-providing circuit 28 and to provide output signals to the counter 14 (FIG. 1), the output-signal and internal-timing circuit 26 includes a one-shot multivibrator 68 and an inverter 70. The one-shot multivibrator 68 includes a NAND gate 72, a capacitor 74, an inverter 76, and a resistor 78.

To receive signals from the input-comparing circuit 24, the conductor 58 is electrically connected to one of the inputs of the NAND gate 72. To provide output-timing signals and internal-timing signals: (1) a first internal-timing conductor 80 is electrically connected to the output of the inverter 76, to the input of the inverter 70, to the other input of NAND gate 72, and to the standard charge-providing circuit 28; (2) a second internal-timing conductor 84 is electrically connected to the output of the NAND gate 72 and one plate of the capacitor 74 at one end, and at its other end to the standard charge-providing circuit 28; and (3) an output conductor 86 of the charge-controlled voltage-to-frequency converter circuit 12 is electrically connected at one end to the output of the inverter 70 and at the other end to the counter 14 (FIG. 1) to provide pulses to the counter 14 proportional to the input current or voltage to the printing integrator 10 (FIG. 1).

To provide a time delay, an RC circuit is connected between the NAND gate 72 and the inverter 76 of the one-shot multivibrator 68, the RC circuit including the capacitor 74 having one plate connected to the output of the NAND gate 72, and its other plate connected to the input of the inverter 76 and the resistor 78 having one end connected to a source of a negative 2.7 volts 88 and its other end connected to the input of the inverter 76.

With these connections, the negative output from the comparator 54 in the input-comparing circuit 24 when the charge on the capacitor 34 is depleted beyond a reference point, causes the NAND gate 72 to provide a positive output pulse to the internal-timing conductor 84 and to the RC circuit including the capacitor 74 and resistor 78 resulting in a decaying positive pulse being applied to the input of the inverter 76.

Upon receiving the positive pulse, the output of inverter 76 is a negative-going pulse corresponding to the positive output of the NAND gate 72. This negative-going pulse is applied to: (1) the other input of the NAND gate 72 to temporarily latch the one-shot multivibrator 68; (2) the standard charge-providing circuit 28 through conductor 80; and (3) the input to the inverter 70.

The positive pulse on internal-timing conductor 84 causes a charge to be transmitted to capacitor 34 in the input-comparing circuit 24, and after the time delay provided by resistor 78 and capacitor 74, causes the one-shot multivibrator 68 to return to its original state, thus applying a negative pulse to internal-timing conductor 84. Internal-timing conductor 80 carries pulses of the opposite polarity to the standard charge-providing circuit 28 as does the internal-timing conductor 84. The output conductor 86 carries pulses from the output of inverter 70 which are opposite in polarity to the output of the inverter 76.

To provide a standard charge periodically in circuit with capacitor 34, the standard charge-providing circuit 28 includes two switches 90 and 92 and a capacitor 98. To control the switches 90 and 92 in accordance with timing signals from the output-signal and internal-timing circuit 26, internal-timing conductor 80 is electrically connected to the gate electrode of the switch 92 and internal-timing conductor 84 is electrically connected to the gate electrode of switch 90.

To transfer a charge from capacitor 98 to the capacitor 34 when the switch 90 is closed by a positive pulse and the switch 92 is opened by a negative pulse, capacitor 98 has one plate electrically connected to the output of switch 92 and to the input of switch 90 and the other plate connected to circuit ground and conductor 42 electrically connects the output of the switch 90 to the input-comparing circuit 24. The input terminal of switch 92 is connected to a source of negative 2.7 volts 106.

With these connections, the capacitor 98 is charged by the reference potential 106 when the switch 92 is closed by a positive pulse on internal-timing conductor 80 and the switch 90 is opened by a negative pulse on internal-timing conductor 84.

At the start of a cycle of operation of the printing integrator 10 (FIG. 1), the voltage-to-frequency converter is in a condition, which for the purposes of this explanation will be referred to as an initial condition. In this condition the output of the comparator 54 is at a negative potential for reasons explained hereinafter in connection with FIG. 3.

The negative output from the comparator 54 causes: (1) a positive pulse from the output of NAND gate 72 and a negative output pulse from the inverter 76 to open the switch 92; and (2) a positive pulse to be applied to switch 90, closing this switch and permitting a charge to flow from the capacitor 98 to the capacitor 34. Thus, an initial condition is immediately established with a standard charge being transferred to the capacitor 34.

This charge is standard because the capacitor 98, in the standard charge-providing circuit 28 has been charged by the regulated reference source of potential 106 through the switch 92. The amount of charge is established by this voltage plus the capacitance of the capacitor 98, which, in the preferred embodiment, is 0.022 microfarads.

As current begins to flow from the interfacing buffer 48, which was selected for the particular instrument, and through the resistors 50 and 52 into the capacitor 34, the charge of capacitor 34 is reduced. The reduction in the charge of capacitor 34 causes the potential at terminal 40 at the output of the operational amplifier 36 to be reduced.

Figure 3:
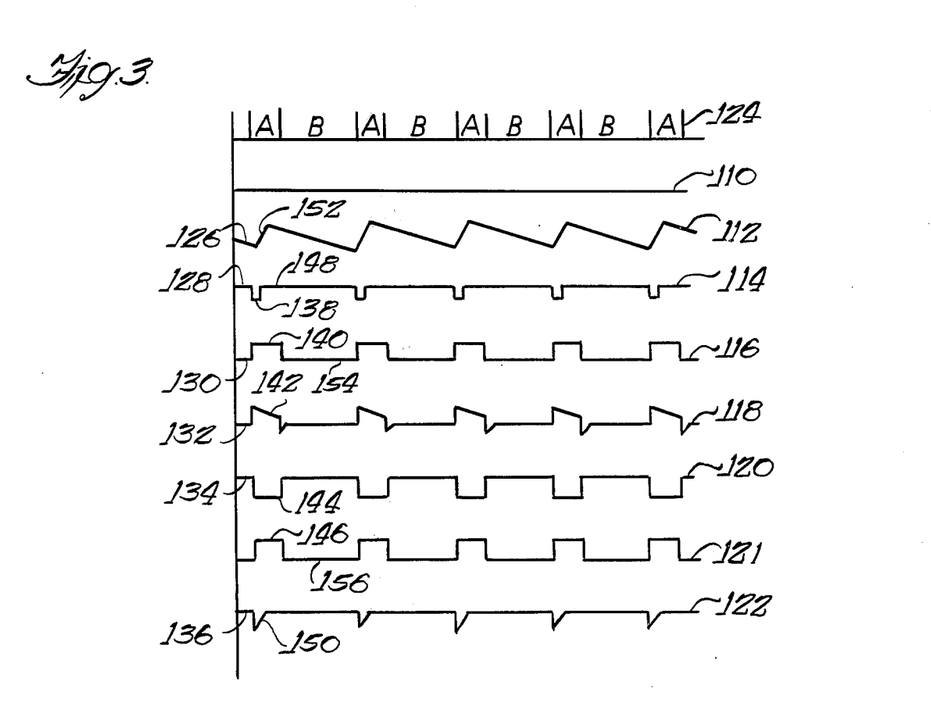
FIG. 3 is a graph of waveforms illustrating the operation of the voltage-to-frequency converter of FIG. 2.

In FIG. 3, there is shown a graph having a plurality of curves 110, 112, 114, 116, 118, 120, 121 and 122, each having the same abscissae of time shown at 124 and different ordinates of voltage. The curves 110-122 illustrate waveforms at different points in the charge-controlled voltage-to-frequency converter circuit 12 (FIG. 2) during the times A and B.

The curve 112 illustrates the waveform at terminal 40 (shown at FIG. 2) and shows at 126 the decreasing potential caused by the beginning flow of current into capacitor 34 due to the signal at input terminal 22 illustrated by the curve 110. During this period of time, while the potential on terminal 40 is falling as is shown at 126 on curve 112: (1) the potential on conductor 58 at the output of the comparator 54 is positive as is shown at 128; (2) the potential at the output of the NAND gate 72 and at the input of the inverter 76 is negative as is shown at 130 and 132 respectively; (3) the potential on internal-timing conductor 80 is positive as is shown at 134 on curve 120; and (4) the potential on conductor 42 is at ground level as is shown at 136 on curve 122.

When the voltage at terminal 40 falls below the voltage on conductor 66, the output of the comparator 54, which is illustrated by curve 114 in FIG. 3, becomes negative as is shown at 138 on curve 114. This negative input triggers the one-shot multivibrator 68 which applies a pulse to internal-timing conductor 80 in response to it.

To trigger the one-shot multivibrator 68, the negative pulse on conductor 58 causes the NAND gate 72 to apply a positive pulse as is shown at 140 on curve 116 to the RC circuit that includes capacitor 74 and resistor 78 (FIG. 2). The RC circuit causes an increase in the positive potential followed by the decay of positive potential on the input to inverter 76 (FIG. 2) as is shown at point 142 on the curve 118 (FIG. 3).

This input to the inverter 76 results in a negative output, as is shown at 144 on curve 120, on internal-timing conductor 80 at the output of inverter 76 until the falling potential shown at 142 drops below a threshold value, thus holding the output of NAND gate 72 high during which time it provides a positive pulse to capacitor 74. When the capacitor 34 is recharged and the RC circuit that includes capacitor 74 and resistor 78 has dropped in potential to a predetermined level that causes inverter 76 to apply a positive pulse to internal-timing conductor 80, both inputs to NAND gate 72 are now positive and its output becomes negative, thus holding the one-shot multivibrator 68 off until the next cycle.

During the time the one-shot multivibrator 68 is triggered, the negative potential on internal-timing conductor 80 opens switch 92. The positive potential at the output of the NAND gate 72 closes switch 90, causing a charge to be applied to capacitor 34 in the input-comparing circuit 24 (FIG. 2).

When a charge is applied to the capacitor 34, the increase in potential caused by that charge at the terminal 40, causes the potential at the positive input of the operational amplifier 54 to increase, again resulting in the output on conductor 58 returning to its positive level as is shown at 148 on curve 114. Pulses on conductor 42, shown at 150 on curve 122, occur during the discharge of capacitor 98.

The change in voltage at terminal 40 due to a signal at terminal 22 is equal to the signal, multiplied by the time, and divided by the capacitance of the capacitor 34 and by a constant determined by buffer amplifier 48 and resistors 50 and 52. Accordingly, the reduction in the potential at terminal 40 is directly proportional to the time, and either the input current or input voltage divided by a known constant. The current caused by the input signal always flows into the capacitor 34 and is never switched out of circuit with the capacitor 34 during the measuring of the current or voltage input, since no gating operations are required in this input-comparing circuit 24.

The standard charge, which is transferred from capacitor 98 to capacitor 34, is transferred with opposite polarity and is precisely controlled in amount of charge. The amount of charge may be controlled with precision because the capacitor 98 is charged to the reference potential of negative 2.7 volts from a regulated supply and the charge is a function only of the potential on the capacitor and the capacitance of the capacitor 98, both of which can be accurately controlled.

To transfer the charge on capacitor 98 to the capacitor 34, the reference voltage 106 is disconnected by the switch 92. Capacitor 98 is connected at this time through the input circuit to the capacitor 34. The charge on capacitor 98 is transferred to the capacitor 34 by discharging through resistor 46 to the virtual ground maintained by operational amplifier 36 at its positive input. Since the frequency is inversely proportional to the time period between pulses, the frequency is proportional to the input signal, divided by an input constant comprising the input resistance, the capacitance of the capacitor 98, the characteristic of the buffer and the reference potential.

When a charge is stored on the capacitor 34 from the reference capacitor as is shown at 150 on curve 122, the potential at terminal 40 begins rising as is shown at 152 on curve 112, causing the output of the comparator 54 to rise again to a positive level and permitting the output of the NAND gate 72 to return to a negative level as is shown at 154 on curve 116. This opens the switch 90. At the same time, the output of the inverter 70 drops as is shown at 156 on curve 121. Switch 92 is closed by the output from the inverter 76 shown on curve 120 to enable a charge to be applied to the capacitor 98.

The time constant of the one-shot multivibrator 68 is approximately 2.2 microseconds and is controlled by the capacitance of the capacitor 74 and the resistance of the resistor 78. This provides a relatively long period of time during which capacitor 98 is discharged.

The time constant for discharging the capacitor 98 into the capacitor 34 is approximately 0.22 microseconds or approximately one-tenth that of the time constant of the one-shot multivibrator 68 to insure an adequate discharge. Because the time constant for discharging capacitor 98 is only one-tenth that of the time constant of the one-shot multivibrator 68, normal changes in the time constants caused by temperature changes or the like do not significantly affect the precision of the circuit.

The specific design which enables the switch 90 to be closed by the output of the NAND gate 72 while the switch 92 is controlled by the output of the inverter 76 is intended to prevent the voltage-to-frequency converter from becoming inoperative due to large over-range signal surges at the input terminal 22. Large over-range signal surges could cause the charge on capacitor 34 to be reduced so quickly by the incoming current, that the potential at terminal 40 drops negative twice during a single time constant of the one-shot multivibrator 68. In such an event, the output of the NAND gate 72 may remain positive because the output of comparator 54 drops negative before the time constant of the one-shot multivibrator 68 elapses and transmits a positive pulse to internal-timing conductor 80. In this event, switch 90 continues to receive a positive pulse and remains closed to provide a direct current path from the reference voltage 106 to capacitor 34. This path enables the charge to increase the potential at the positive input of comparator 54 to begin another cycle and prevent locking of the circuit.

Figure 4:
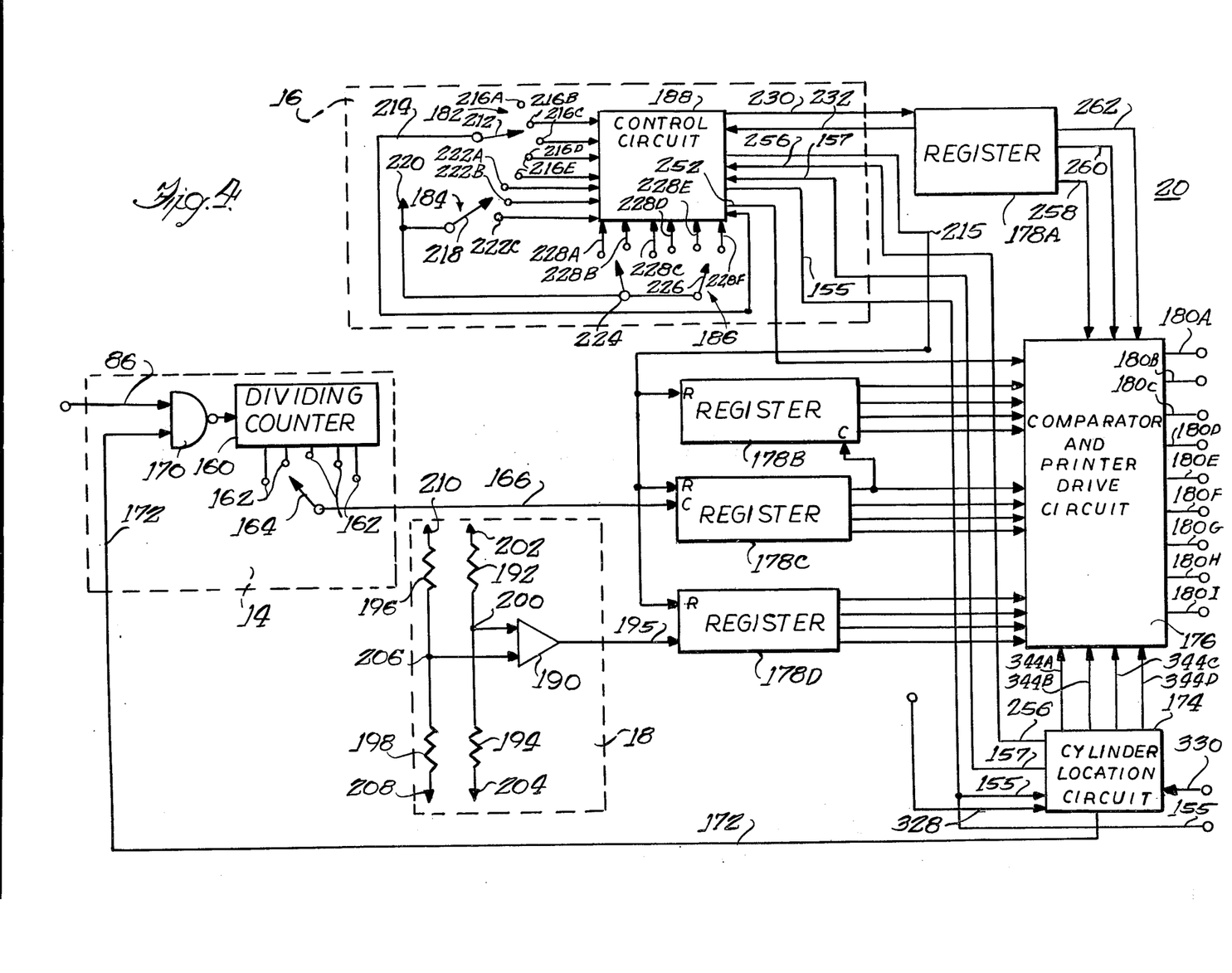
FIG. 4 is a block diagram of another portion of the printing integrator of FIG. 1.

In FIG. 4, there is shown a block diagram of the counter 14, the battery check circuit 18, the time-set circuit 16 and a portion of the printer 20. The counter 14 is electrically connected to the charge-controlled voltage-to-frequency converter circuit 12 (FIGS. 1 and 2) by the conductor 86. The counter 14, time-set circuit 16 and battery check circuit 18 are connected to the printer 20 in the manner illustrated in FIG. 1 except that a more detailed diagram is shown. Only a portion of the printer 20 is shown in FIG. 4.

To set a scale for the printout, the counter 14 includes a dividing counter 160 having a plurality of taps 162 and a selector switch 164 which is manually operated. The selector switch 164 may be adjusted to any of the taps 162 and results in a scaling factor of the counts applied to the printer 20 through a conductor 166. This enables wider variations of data to be printed by a given printer without exceeding its capacity. The scale factor may be selected to enable a readout in any predetermined set of units such as, for example, kilowatt hours per meter squared, ampere-hours, degree-days or the like. Of course, the scale factor may be provided by other circuits such as rate multipliers, microprocessors or the like.

After each printout, the dividing counter 160 is reset by a pulse applied to its reset input terminal from the cylinder location circuit through a conductor (not shown). To control the application of pulses to the dividing counter 160, a NAND gate 170 has its output connected to the count input terminal of the dividing counter 160 and one of its two inputs connected to conductor 86 and the other connected to a conductor 172 which receives an energization pulse when the printing integrator is in operation.

To print data, the printer 20 includes a cylinder location circuit 174, a comparator and printer drive circuit 176, a printer (not shown) and a plurality of registers, four of which are shown at 178A–178D in FIG. 4 as an illustrative example. In the preferred embodiment, fourteen registers are actually used, six for time, four for data, one for the dividing counter position, one for low-battery indication, one for manual print and one for an asterisk. The conductor 166 is electrically connected to the register 178C to apply data thereto indicating the units digit of the signal applied by the voltage-to-frequency converter to conductor 86. The register 178C is cascaded to the register 178B to provide the tens digit data to the register 178B. The registers are each electrically connected to the comparator and printer drive circuit 176 to provide data to the comparator. Two additional registers store hundreds and thousands digits.

The cylinder location circuit 174 provides signals to the comparator and printer drive circuit 176 indicating the location of the print cylinder on the printer and, when the data indicated in the registers 178B and 178C corresponds to the information on the print cylinder ready for printing as indicated by the cylinder location circuit 174, the comparator and printer drive circuit 176 causes a printing operation to be performed to record the data.

The register 178A is electrically connected to the time-set circuit 16 to receive data indicating the day, hour and minute and provides this information to the comparator and printer drive circuit 176 for printing next to the data contained in the registers 178B and 178C. In the preferred embodiment, two different registers or parts of registers are used to store each of the day, hour and minute information. Similarly, the register 178D is electrically connected to the battery check circuit 18 to print a "B" next to the data and the date and time of day whenever the battery is low so that it may be changed before the accuracy of the unit is affected. Instead of a register, a special comparator or gating circuit may be used within the comparator and printer drive circuit 176 to recognize the "B" location on the print cylinder whenever a signal is provided by amplifier 190. Any type of conventional cylinder printer may be electrically connected to the output conductors 180A-180I of the comparator and printer drive circuit 176. Similarly, other arrangements may be used for the other registers such as two or more of the functional registers being structurally different parts of the same registers or the like.

The time-set circuit 16 includes a manually-operated print interval switch 182, a three-position print-inhibit, print-enable, paper-advance switch 184, a start-reset increment switch 186 and a control circuit 188.

The print-interval switch 182 selects the time increments at which a printout is to occur and includes for this purpose: (1) a movable switch arm or armature 212 electrically connected to the control circuit 188; and (2) five stationary contacts 216A-216E each of which is connected to a different output of the register 178A through the control circuit 188 to receive a pulse at the end of each preselected interval corresponding to that contact. For example, contact 216A is an off position contact, contact 216B is a one minute contact and it is connected to an output of the register 178A through the control circuit 188 that provides a signal each minute. Similarly, contact 216B is connected to an output that receives a signal every ten minutes, contact 216D every hour and 216E every 24 hours.

The three-position print-inhibit, print-enable, paper-advance switch 184 in one embodiment includes: (1) a switch arm or armature 218 electrically connected to a source of positive potential 220; and (2) three stationary contacts 222A-222C connected to the control circuit 188 to select the manual mode of operation, the automatic mode or paper advance. In another embodiment, (not shown) the three-position print-inhibit, print-enable, paper-advance switch 184 is a conventional single-pole double-throw on-off-on switch that performs the same basic function to provide: (1) a positive 2.7 volt paper-advance signal on one conductor; (2) a negative 2.7 volt print-enable signal; and (3) a positive 2.7 print-inhibit signal on another conductor.

The start-reset increment switch 186 in one embodiment includes: (1) a first switch arm 224 and a second switch arm 226, both of which are electrically connected to the source of positive potential 220; and (2) six stationary contacts 228A-228F, three contacts, namely 228A-228C to reset and start the date and time registers and three contacts, namely 228D-228F to increment the hour register 266. These functions may also be provided by a four-pole double-throw on-on-on switch.

To provide an indication to the register 178D when the battery potential is low, the battery check circuit 18 includes a comparator 190, first and second resistors 192 and 194 and third and fourth resistors 196 and 198. Resistors 192 and 194 are connected together at terminal 200, which is applied to one input of the comparator 190, with the opposite end of the resistor 192 being connected to a regulated source of positive 2.7 volts 202 and the opposite end of resistor 194 being connected to a negative source 204 from the battery in the printing integrator 10.

The resistors 196 and 198 are connected at one of their ends to the terminal 206 which is also connected to the other input of the comparator 190, with the second end of the resistor 198 being electrically connected to a negative 2.7 volt regulated source 208 and the opposite end of the resistor 196 being connected to an unregulated positive source 210 from the battery. The resistors 194 and 196 are each 475 K (kilohm) one-percent resistors, the resistor 198 is a 259 K resistor and resistor 192 is a 259 K resistor so that the output of the comparator 190, conductor 195, is negative unless the unregulated potentials drop, in which case it becomes positive and causes a signal to be recorded in the register 178D, which results in a "B" being printed at successive data readouts until reset. In the embodiment having a special comparator, the readout occurs until the potential of the battery increases and potential from comparator 190 becomes positive.

Figure 5:
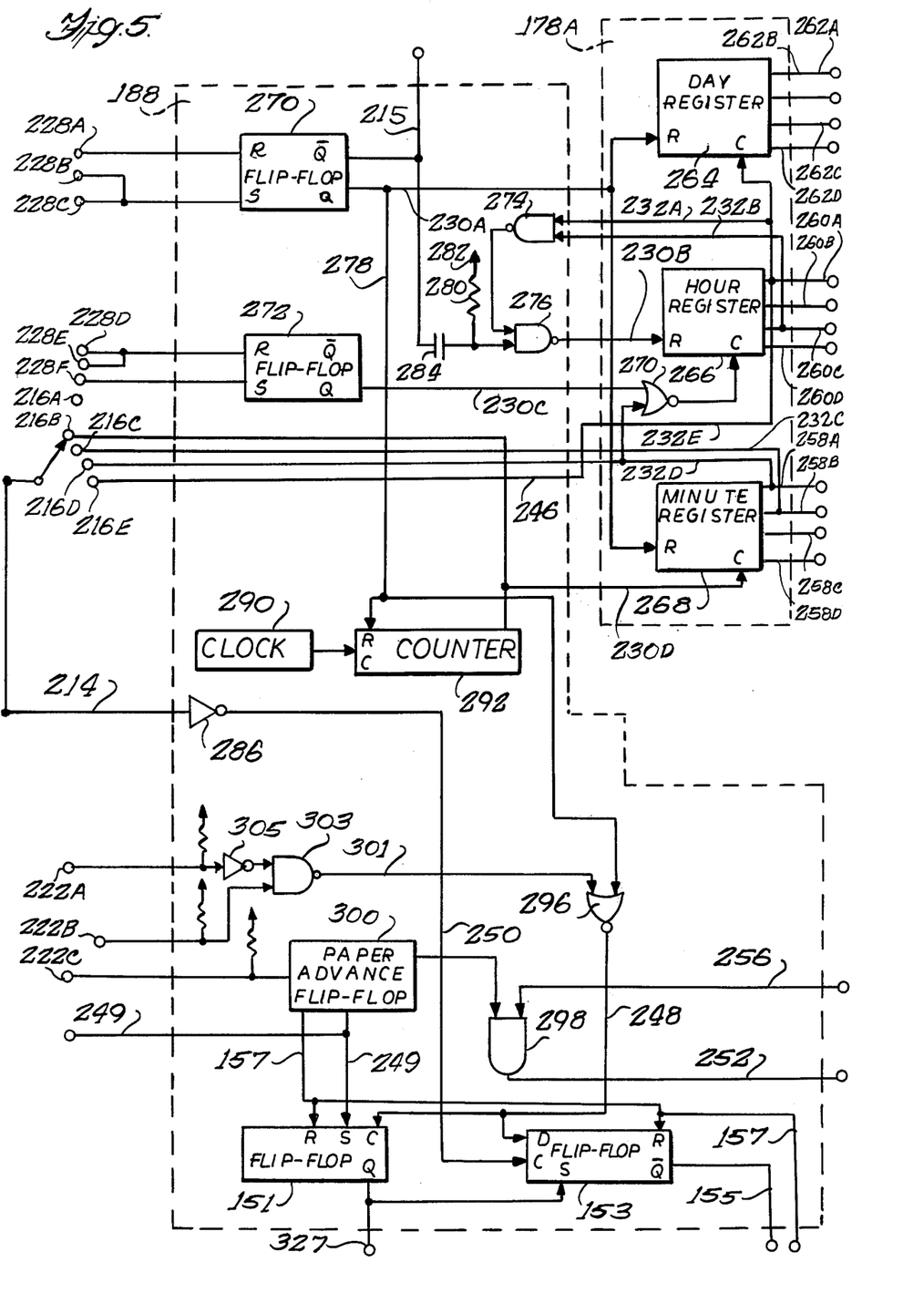
FIG. 5 is a logic circuit diagram of another portion of the printing integrator of FIG. 1.

In FIG. 5, there is shown a logic circuit diagram of the control circuit 188 and the time register 178A. The control circuit 188 is electrically connected to the time register 178A by: (1) conductors 230A and 230B which apply reset pulses to the individual stages of the register 178A; (2) conductor 230C which applies hour manual increment signals from the control circuit 188 to the time register 178A; (3) conductor 230D which applies minute pulses to the register 178A; (4) conductors 232A and 232B which apply time reset pulses from the time register 178A to the control circuit 188 to aid the control circuit 188 in applying proper reset pulses back to the time register 178A; and (5) conductors 232C, 232D and 232E which apply 10 minute, one hour and day signals respectively from the time register 178A to the control circuit 188 to determine the time of printout.

To generate print control signals for the cylinder location circuit 174 (FIG. 4) through conductor 155, the control circuit 188 includes a manual-print clocked D flip-flop 151 and a main-print clocked D flip-flop 153. The clock input terminal of the main-print flip-flop 153 is connected to conductor 250 to receive automatic print commands and the set input terminal is connected to the Q output terminal of the manual-print flip-flop 151 which is electrically connected to conductor 327 to supply a pulse to a manual print register (not shown) to control the printing of an "M" indicating a manual printout. The set input terminal of the manual-print flip-flop 151 is connected to conductor 249 to receive first manual-print command signals. The D input terminal of flip-flop 153 and the clock input of flip-flop 151 are connected to conductor 248 to receive second manual-print command signals.

To reset the flip-flops 153 and 151 after a print cycle, conductor 157 from the cylinder location circuit 174 (FIG. 4) is electrically connected to the reset input terminals of flip-flops 151 and 153. Conductor 157 also resets the paper-advance flip-flop 300. Conductor 155 resets circuits in the cylinder location circuit 174 and starts the motor which rotates the print cylinder.

To advance the paper within the printer (not shown in FIG. 5) when the paper-advance switch energizes the paper-advance contact 222C, the conductor 249 receives a signal from the paper-advance flip-flop 300 and a binary zero is applied to AND gate 298 to inhibit the hammer trigger pulses on conductor 252, thus preventing printing but enabling paper advance by setting manual-print flip-flop 151.

To enable printing operations, the paper-advance flip-flop 300 must be reset by a pulse on conductor 157 which enables AND gate 298 and permits hammer trigger pulses from the cylinder location circuit 174 to be passed to conductor 252 into the comparator and printer drive circuit 176.

The input signals to control circuit 188 described in connection with FIG. 4 are also shown in FIG. 5 and include: (1) the stationary contacts 228A-228F of the start-reset increment switch 186 (FIG. 4); (2) the stationary contacts 216A-216E and the movable switch arm 212 (FIG. 4) of the print-interval switch 182 (FIG. 4); and (3) the stationary contacts 222A-222C of the three-position print-inhibit, print-enable, paper-advance switch 184 (FIG. 4). Additionally, an input conductor 256 provides pulses to the control circuit 188 indicating that each row of the print cylinder is properly aligned for a printing operation so that these pulses may be applied by the control circuit 188 to conductor 252 through AND gate 298. Conductor 215 (during manual setting of the starting time) resets the data registers 178B, 178C and dividing counter 160 (FIG. 4) and temporarily resets the hour register 266 of the time register 178A through a NAND gate 276 and through conductor 230B which register later returns to an operating condition for incrementing because of the RC circuit including capacitor 284, resistor 280 and positive source of potential 282.

The time register 178A includes: (1) four output conductors 258A-258D which indicate the minute in binary-coded decimal form; (2) four conductors 260A-260D which indicate the hour in binary-coded decimal form; and (3) four output conductors 262A-262D which indicate the day in binary-coded decimal form. In the preferred embodiment, eight conductors are required to provide two digits in decimal form on all lines.

To provide output signals indicating the minute, hour and day in response to input signals from the control circuit 188, the time register 178A includes three registers 264, 266 and 268 and a NOR gate 270. The day register 264 has its outputs electrically connected to conductors 262A-262D to provide output signals indicating the day; the hour register 266 has its outputs electrically connected to the output conductors 260A-260D to indicate the hour; and the minute register 268 has its outputs electrically connected to the output conductors 258A-258D to indicate the minute.

A third bit position (shown as the second position in FIG. 5) of the hour register 266 is also electrically connected to conductor 232B and a sixth bit position (shown as the fourth position) is electrically connected to conductor 232A and to the count input terminal of the day register 264 to cause the day register 264 to count one day for each 24 hours, registered in the hour register 266 and to cause a signal to be applied to the control circuit 188 indicating that the hour register 266 is now ready to be reset. The last bit positions of each of the two decades of the minute register 268 (shown as the last two positions in FIG. 5) and the sixth bit position of hour register 266 are connected to the control circuit 188 to indicate increments of time for use in determining the period for integration and printing, with the sixth bit position of hour register 266 being connected to conductor 232A or 232E, the last bit position of the second decade of minute register 268 being connected to conductor 232D and, the last bit position of the first decade of minute register 268 being connected to conductor 232C.

To control the resetting and the incrementing of the time register 178A, the control circuit 188 includes a first flip-flop 270, a second flip-flop 272, a first NAND gate 274, and a second NAND gate 276. The reset input of the flip-flop 270 is electrically connected to contact 228A and its $\overline{Q}$ output is connected to conductor 215 and to one input of the NAND gate 276 through a capacitor 284 to cause a reset pulse to be applied temporarily to the hour register 266 to permit incrementing later.

The set input of the flip-flop 270 is electrically connected to the contacts 228B and 228C and its Q output is electrically connected to: (1) conductor 230A to apply positive reset pulses to the reset terminals of the day register 264 and the minute register 268 of the time register 178A; (2) a conductor 278 which is connected to reset counter 292 which controls the pulses applied to the time register 178A and which is connected to one input of NOR gate 296 to insure a binary zero on conductor 248 to prevent printing during incrementing. The NAND gate 276 is biased by a resistor 280 connected at one end to one input of the NAND gate 276 and at its other end to a source of positive potential 282 to normally apply a negative potential to the reset terminal of hour register 266 except when flip-flop 270 has just been set or a signal is received from NAND gate 274. The flip-flop 272 has its reset input connected to contacts 228D and 228E and its set input connected to contact 228F with its Q output being connected to conductor 230C to apply count pulses to the hour register 266 of the time resister 178A for incrementing that register.

To control the time increment across which integration and printing is to occur, the control circuit 188 electrically connects contacts 216B-216E with conductors 230D and 232C-232E respectively. The switch arm 212 (FIG. 4) is electrically connected to conductor 250 through an inverter 286 so that the switch arm 212: (1) is in the off position when it is in contact with contact 216A; (2) is in the minute position when it is in contact with contact 216B; (3) is in the 10 minute position when it is connected to contact 216C; (4) is in the hour position when it is in contact with contact 216D; and (5) is in the day position when it is in contact with contact 216E. At the end of the respective period, it applies a signal to conductor 250 to initiate a print operation at the end of the integrating period.

To provide minute pulses to conductor 230D the control circuit 188 includes a clock pulse generator 290 and a counter 292, with the clock pulses from the clock 290 being applied to the count input terminal of the counter 292 and its output being connected to conductor 230D. The clock and counter outputs are selected so that pulses are applied to conductor 230D once each minute. The reset input of the counter 292 is connected to conductor 278 to be reset when flip-flop 270 is set.

To control the paper advance and to provide inhibit signals and manual control over the period of time across which integration occurs, the control circuit 188 includes a NOR gate 296, an AND gate 298 and a paper-advance flip-flop 300 and a three-position print-inhibit, print-enable, paper-advance switch 184 (FIG. 4). In the embodiment in which switch 184 was an on-off-on switch, conductor 301 receives a positive signal when switch arm 218 is in contact with contact 222A and a negative potential when the switch arm is in contact with contact 222B. In this embodiment, a positive pulse is applied to contact 222C in the third position.

In the embodiment shown in FIG. 5, the same effect is obtained by NAND gate 303 and inverter 305 with NAND gate 303 having one input electrically connected to contact 222A through inverter 305 and the other input connected to contact 222B. Contact 222C is connected to the paper-advance flip-flop 300. The output of NAND gate 303 is connected to conductor 301. Contacts 222A-222C are each electrically connected to a negative source of potential through a resistor to maintain a normal binary zero when not closed to the switch arm. When switch arm 218 (FIG. 4) is in contact with 222A, conductor 301 is high which causes conductor 248 and the D input of flip-flop 153 to be low, thus preventing automatic printing due to clocking on conductor 250.

When the switch arm 218 (FIG. 4) is closed to contact 222B, conductor 301 is negative and causes conductor 248 and the D input of flip-flop 153 to be high thus permitting automatic printing. When the cylinder is aligned as is indicated by a pulse from the cylinder location circuit 174 (FIG. 4) on conductor 256 which is connected to one input of the AND gate 298, pulses are applied to conductor 252 resulting in a printout if a positive signal is also present on the other input of AND gate 298 from the paper-advance flip-flop 300.

When the switch arm 218 is on contact 222C, the paper-advance flip-flop 300 is set to apply a print-command pulse to the manual flip-flop 151 through conductor 249 as well as to the input of the AND gate 298 to permit paper advance while inhibiting printing.

Figure 6:
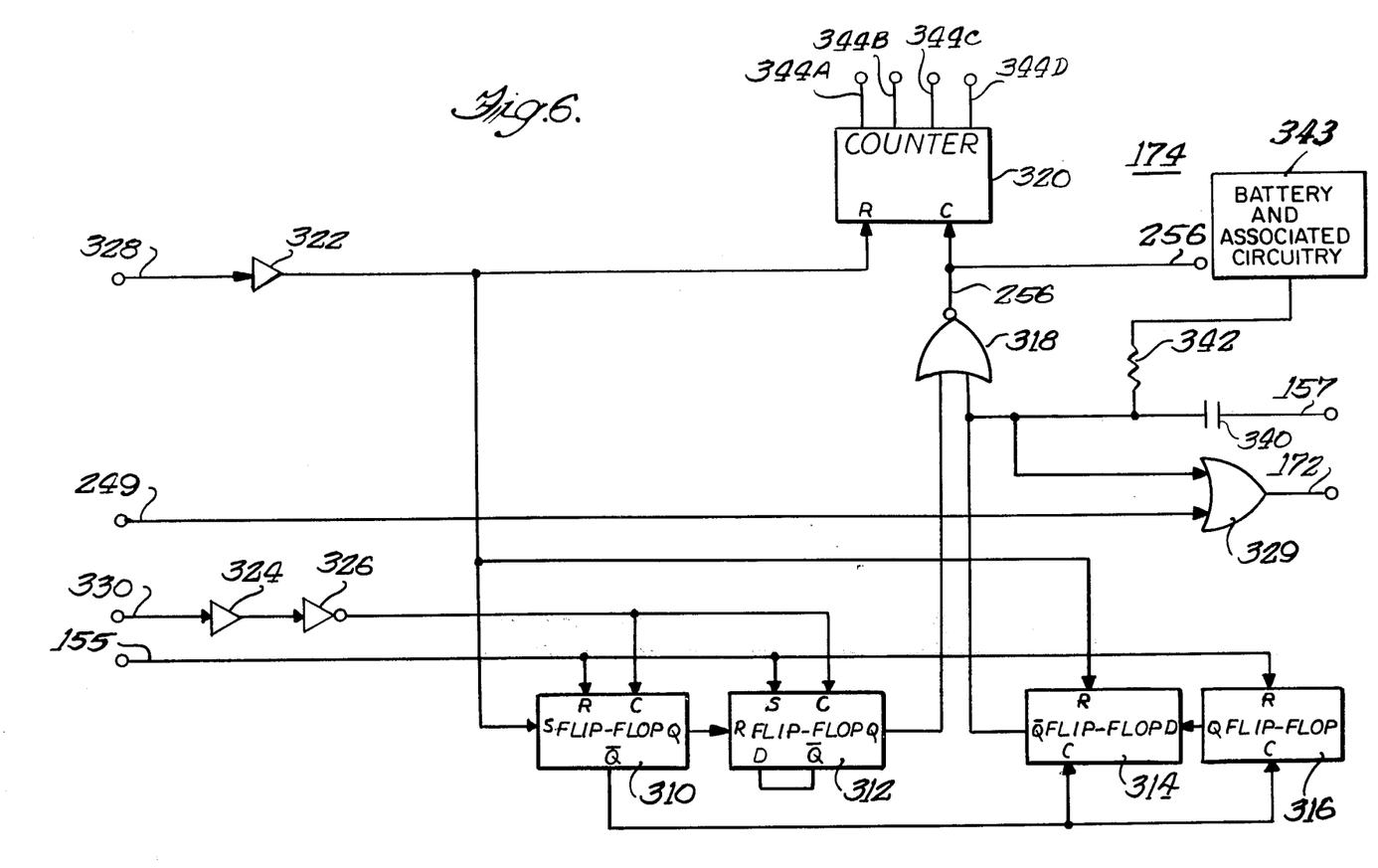
FIG. 6 is a schematic circuit diagram of still another portion of the printing integrator of FIG. 1.

In FIG. 6, there is shown a schematic circuit diagram of the cylinder location circuit 174 having four flip-flops 310, 312, 314 and 316, a NOR gate 318, a binary counter 320, Schmidt triggers 322 and 324, an inverter 326 and an OR gate 329.

To receive signals from the printer 20 (FIG. 4), conductor 330 is electrically connected through the Schmidt trigger 324 and the inverter 326 in series to the count input terminals of flip-flops 310 and 312. Conductor 328 is electrically connected through the Schmidt trigger 322 to the reset terminal of counter 320, to the set input terminal of flip-flop 310 and to the reset input terminal of flip-flop 314. With these connections, two timing pulses indicating the start and the end of each row on the printing cylinder are applied to the flip-flops 310 and 312 from conductor 330 and a reset pulse is applied to the reset input terminal of counter 320, to the set input terminal of flip-flop 310 and to the reset terminal of flip-flop 314 at the start of each revolution of the printing cylinder. These pulses are generated by a magnetic pick up (not shown) which detects magnetic flux at selected locations on discs (not shown) that rotate with the print cylinder, one spot being magnetic on one disc to provide pulses to conductor 328 and pairs of spots corresponding to each row being magnetic on another disc to provide pulses to conductor 330.

Conductor 155, which starts the rotation of the cylinder, is electrically connected to the reset input terminal of flip-flop 310, the set input terminal of flip-flop 312 and the reset input terminal of flip-flop 316 so that during a printing cycle, the flip-flops 312 and 314 apply location pulses to the NOR gate 318.

To generate the location pulses, flip-flop 310 has its Q output electrically connected to the reset input terminal of the flip-flop 312 and has its negative $\overline{Q}$ output connected to the count input terminals of flip-flops 314 and 316. Flip-flop 316 has its Q output electrically connected to the D input of flip-flop 314, the D input and the negative $\overline{Q}$ input of flip-flop 312 being connected together.

To provide hammer trigger pulses corresponding to each row of print numerals during a print cycle to the count input terminal of counter 320 and to conductor 256, the Q output of flip-flop 312 and the negative $\overline{Q}$ output of flip-flop 314 are each electrically connected to different inputs of the NOR gate 318, the output of which is electrically connected to conductor 256 and to the count input terminal of counter 320. The hammer trigger pulses are caused by: (1) pulses from the Q output of flip-flop 310 to the reset input of flip-flop 312; (2) reset pulses from Schmidt trigger 322; and (3) binary one pulses from the Q output flip-flop 316 to the D input of flip-flop 314.

To provide reset output pulses at the end of a printout cycle, pulses are generated by the cylinder location circuit 174 at the end of each cylinder rotation but are blocked if there is a manual print. These pulses are applied to the reset terminal of registers 178B, 178C (not shown) and dividing counter 160. To permit paper advance, the pulses at the end of the cylinder rotation cycle are also transmitted to the paper-advance solenoid in the printer.

To inhibit output pulses from the voltage-to-frequency converter from clocking the dividing counter 160 so that registers 178B and 178C do not change state during printing, the negative $\overline{Q}$ output of flip-flop 314 is electrically connected to one input of the OR gate 329 and to conductor 157 through an RC circuit comprising a capacitor 340 with one plate electrically connected to the negative $\overline{Q}$ output of flip-flop 314 and the other plate connected to conductor 157 and a resistor 342 electrically connecfted at one end to the negative $\overline{Q}$ output of flip-flop 314 and at the other end to a source of negative 2.7 volts which may be derived from a battery 343 through associated circuitry. In numerous places in this specification sources of potential, potentials, sources of negative voltage, batteries and sources of potential from batteries are mentioned. These may all be derived from the same battery 343 through associated circuitry or from different batteries or other sources of potential in a manner well known in the art. In order not to inhibit the same pulses during a paper advance, conductor 249 is electrically connected to another input of the OR gate 329, the output of which is electrically connected to conductor 172.

The cylinder location circuit 174 cooperates with the data registers and the printer in a unique manner which is particularly economical under some circumstances. To control printing by a printer having a rotating element such as a print cylinder, the printing must be inhibited until the rotating element is brought up to speed from a stop and the printing of selected characters must be synchronized with the rotating element. The cylinder location circuit 174 is designed to be inexpensive and to be able to bring a print cylinder up to speed before printing starts, synchronize the printing of one line and permit the cylinder to come to a rest. This mode of operation unexpectedly requires a minimum of components.

To inhibit printing unitl the cylinder reaches a steady speed, flip-flops 314 and 316 inhibit hammer trigger pulses until after one or two revolutions of the printer cylinder. To accomplish this, flip-flop 316 is reset by a pulse on conductor 155 when the drive motor for the print cylinder stops and has its D input connected to a positive 2.7 volts source of potential (not shown). The first time the print cylinder causes a pulse to be generated on conductor 328, flip-flop 310 is set and, since it has its D input connected to a source of a negative 2.7 volts potential, it provides a high to flip-flop 312 and lows to flip-flops 314 and 316. Since flip-flop 316 is reset at this time, flip-flop 314 has a low applied to its D input by flip-flop 316 and continues to apply a high from its $\overline{Q}$ output to NOR gate 318.

Following the set pulse on conductor 328, the first positive pulse from the output of inverter 326 clocks flip-flop 310 causing it to apply highs to flip-flops 314 and 316. The negative pulse formed by setting and clocking flip-flop 310 and transmitted to flip-flops 314 and 316 switches flip-flop 316 and does not affect flip-flop 314 since flip-flop 314 has a low on its D input.

The next pulse on conductor 328 occurring one revolution later again sets flip-flop 310, which provides a negative pulse to flip-flops 314 and 316 that lasts until the first pulse from inverter 326. The flip-flop 314 is clocked by this pulse since it now receives a positive pulse on its D input, causing it to apply a negative pulse to NOR gate 318 until the next pulse on conductor 328. The negative pulse applied to NOR gate 318 enables pulses to be gated from the Q output of flip-flop 312 to counter 320 and to conductor 256.

The next pulse on conductor 328 resets flip-flop 314, thus generating a positive pulse that: (1) prevents NOR gate 318 from applying further hammer trigger pulses to counter 320 and conductor 256; and (2) is differentiated by the RC circuit including resistor 342 and capacitor 340 to turn off the motor and reset flip-flops 151 and 153 (FIG. 5) to prepare for the next printing cycle.

Flip-flop 312 is clocked by pulses from inverter 326 to apply hammer trigger pulses to NOR gate 318 which hammer trigger pulses have a duration extending between the pulse generated at the start of each row of the print cylinder and the pulse generated at the end of each row. Flip-flop 310 serves as a phase control by temporarily resetting flip-flop 312 at the beginning of each rotation of the print cylinder due to the reset pulses on conductor 328. Flip-flop 310 also serves as a time-delay circuit so that flip-flops 314 and 316 are clocked after the removal of the reset of flip-flop 314 due to the reset pulses on conductor 328. Flip-flop 312 serves as a divide-by-two circuit for the pulses on conductor 330.

To permit the printer to known when the printing cylinder is aligned with the data stored in the time and data registers 178A–178D so as to time the energization of a print anvil, counter 320 includes four outputs 344A–344D which indicate, in binary form, the number of trigger pulses transmitted to it through conductor 256 from the start of a revolution of the cylinder so that, when the proper row is aligned for printing, the comparison circuits can initiate a printout to the printer 20. For higher accuracy with smaller print intervals, another embodiment would permit the dumping, within a few microseconds during printing of the registers 178 into buffer registers for printing. This would prevent the temporary interruption of data during a printing cycle in a manner known in the art.

Although, in the embodiments of FIGS. 2 and 3, switch 92 is opened at the same time that switch 90 is closed and vice versa, it may be desirable in some embodiments to: (1) open switch 92 before closing switch 90 to discharge capacitor 98; and (2) open switch 90 before closing switch 92 to charge capacitor 98. This prevents a charge from flowing directly from source 106 to capacitor 34 during switching operations.

Figure 7:
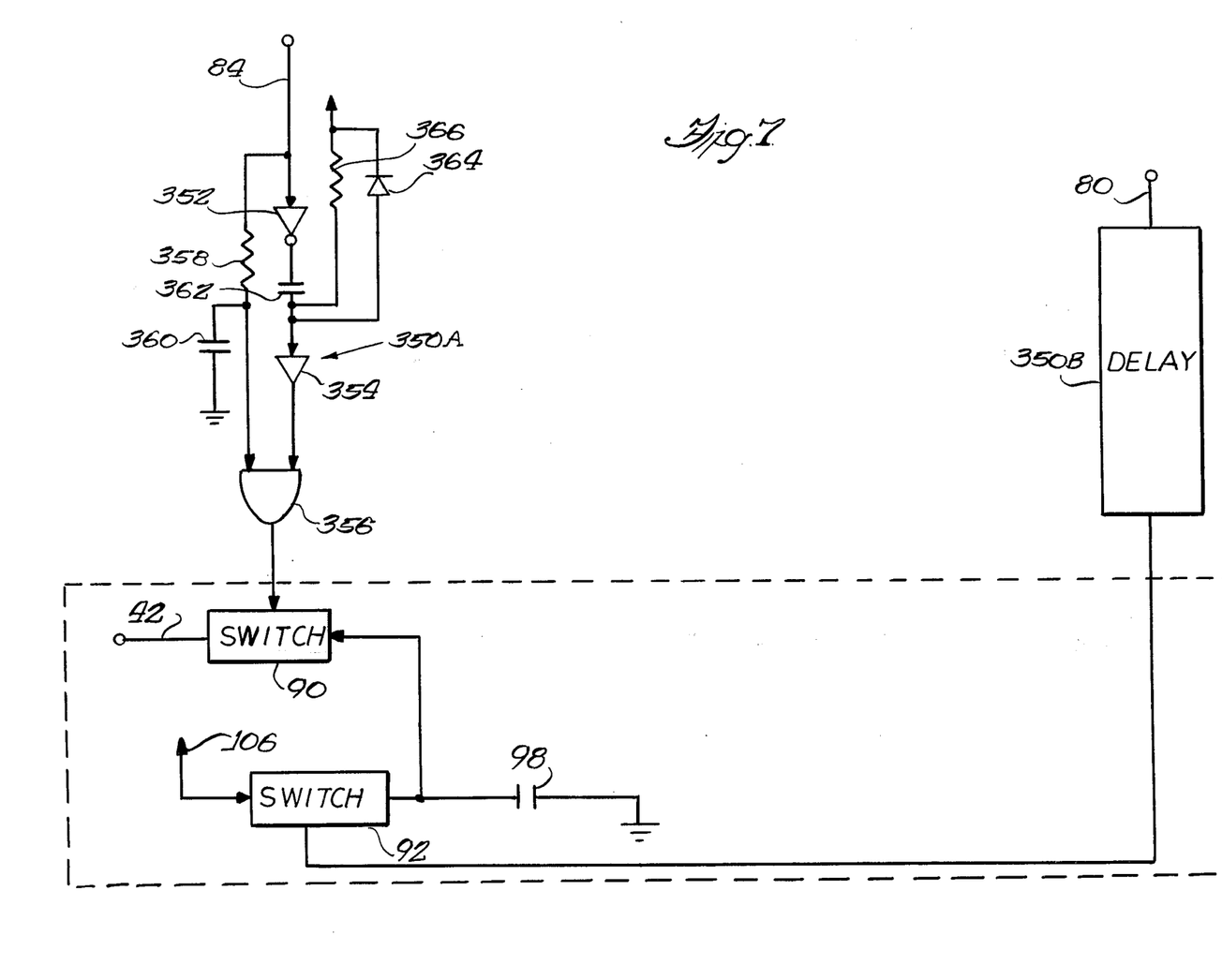
FIG. 7 is a schematic circuit diagram of a portion of a voltage-to-frequency converter which forms a portion of another embodiment of the printing integrator.

In FIG. 7, there is shown an arrangement for delaying the closing of the switch 90 until the switch 92 has been opened and delaying the closing of the switch 92 until after the switch 90 has been opened. This circuit includes two positive pulse delay circuits 350A and 350B, which are identical in structure and serve the same purpose except that the delay 350A is connected to conductor 84 and switch 90 within the charge replenishing circuit 28 and delay 350B is connected to conductor 80 and switch 92.

To delay a positive pulse, the delay circuit 350A includes an inverter 352, pulse former or buffer 354, which may be a Schmidt trigger, and an AND gate 356. Conductor 84 is electrically connected to the input of the inverter 352 and to one of two inputs of the AND gate 356 through a resistor 358, with that one input of the AND gate 356 being connected to ground through capacitor 360 to form an RC delay circuit between the conductor 84 and the one input of the AND gate 356.

The output of the inverter 352 is connected to the input of the buffer 354 through a capacitor 362, the input of the buffer 354 being connected to a source of positive potential through the forward resistance of a diode 364 and a resistor 366 in parallel to provide a differentiator with peak limiting by the diode 364. With this circuit, the AND gate 356 receives two positive input pulses only after the time delay is determined by the RC delay circuit including resistor 366 and capacitor 362, thus delaying the leading edge of a positive output pulse from the AND gate 256 but permitting the trailing edge to return at approximately the same time. The delay 350B operates in the same manner.

It can be seen from the above description that the invention has several advantages such as: (1) it is accurate in operation; (2) it provides an indication when the battery potential is dropping; (3) the printout is particularly useful because of its indication of the time of printout of data; (4) it is adaptable for measuring the current or voltage outputs of a wide range of instruments across large fluctuations of the outputs of those instruments; and (5) it is inexpensive.

The accuracy of the instrument is primarily obtained because of the characteristics of the charge-controlled voltage-to-frequency converter circuit 12. The input current or voltage which is being measured is not sampled in the charge-controlled voltage-to-frequency converter circuit 12 but is continuously applied to the capacitor 34 (FIG. 2) so that there is not charge lost during a gating operation.

The circuit does not suffer from inaccuracies because of differences in the charging time of the storage capacitor 98 which applies a controlled charge to the capacitor 34 since it is only necessary that that capacitor be completely discharged. The charge of current is dependent only on parameters which can be accurately controlled such as the storage capacitor 98 and the regulated voltage or the offset of the operational amplifier 36. The offset of the amplifier can be adjusted by a potentiometer and the other parameters can be precision controlled unlike certain circuits which rely on the flow of current rather than charge as a standard.

The printing integrator is surprisingly inexpensive. The circuitry is relatively simple because the data and the time and battery condition are printed in a single row by a cylinder printer from buffers that store it, thus permitting the elimination of complex timing circuitry normally associated with equipment of this type.

Although a preferred embodiment of the invention has been described with some particularity, many modifications and variations in the preferred embodiment are possible without deviating from the invention. Accordingly, it is to be understood that within the scope of the appended claims, the invention may be practiced other than as specifically described.

What is claimed is:

1. Apparatus comprising:
    means for storing charge;
    said means for storing charge comprising an input capacitor;
    means for applying a predetermined amount of charge to said input capacitor to charge said input capacitor with a first polarity;
    input means adapted to carry a signal to be measured;
    said input means including input-circuit means connected in circuit with said input capacitor for causing flow of charge related to said input signal, whereby said charge on said input capacitor is reduced by said input signal;
    means for generating an output pulse when said charge on said means for storing charge falls below a predetermined level;
    said means for applying a predetermined amount of charge including the means for applying said charge in time relationship with said output pulse, whereby a series of output pulses are produced proportional to the current on said means for carrying said input signal;
    said means for applying charge comprising a reference capacitor;
    means for storing a standard amount of charge on said reference capacitor; and
    means connected to said means for generating a pulse for applying said charge to said input capacitor with a first polarity upon the generation of said pulse.

2. Apparatus according to claim 1 in which said means for generating an output pulse comprises:
    a comparator;
    said comparator having one input terminal electrically connected to said input capacitor and a second input terminal adapted to be connected to a source of reference potential;
    means for generating a pulse whenever said comparator indicates a predetermined ratio of potentials between said first terminal and said second terminal.

3. Apparatus according to claim 2 in which said means for storing a standard charge on said reference capacitor comprises:
    a source of reference potential; and
    at least one switch connecting said reference capacitor to said means for storing a standard charge with said first polarity and operable to be closed upon the generation of each pulse from said means for generating a pulse.

4. Apparatus according to claim 3 in which said means for applying a predetermined amount of charge with a first polarity comprises an operational amplifier having said input capacitor connected in a feedback loop around said operational amplifier.

5. Apparatus according to claim 4 further comprising means for counting said pulses across a preset increment of time.

6. Apparatus according to claim 5 further comprising a printing means for printing a number relating to said stored numbers of pulses in said increments of time.

7. Apparatus according to claim 6 further comprising means for printing a "B" when said standard potential drops below a predetermined level.

8. Apparatus according to claim 7 further including means for printing the time at which each of said increments of time ends.

9. Apparatus according to claim 1 in which said means for applying a predetermined amount of charge with a first polarity comprises an operational amplifier having said input capacitor connected in a feedback loop around said operational amplifier.

10. Apparatus according to claim 9 further comprising means for counting said pulses across a preset increment of time.

11. Apparatus according to claim 10 further comprising a printing means for printing a number relating to said stored number of pulses in said increments of time.

12. Apparatus according to claim 11 further comprising means for printing a "B" when said standard potential drops.

13. Apparatus according to claim 12 further including means for printing the time at which each of said increments of time ends.

14. Apparatus according to claim 1 in which said means for storing a standard charge on said reference capacitor comprises:
    a source of reference potential; and
    at least one switch connecting said reference capacitor to said means for storing a standard amount of charge operable to be closed upon the generation of each pulse from said means for generating a pulse.

15. Apparatus according to claim 1 further comprising means for counting said pulses across a preset increment of time.

16. A printing integrator comprising:
    input means for carrying an input signal to be integrated and to have its value printed out;
    means for generating pulses related to said input signal on said input means;

means for counting said pulses;
means for generating clock pulses;
means for storing the count of said means for counting said pulses, whereby the integral of said input signal is stored and for storing said time of day of the measurement as measured by said clock pulses;
a printing cylinder including printing type;
a plurality of printing hammers;
means for actuating said printing hammers to press paper between said printing cylinder to print said type;
said means for actuating including means for printing in a single row across a sheet of paper the count of said pulses and said time of day;
motor means for turning said cylinder; and
means for determining from said information stored in said means for storing when said hammers are to be actuated.

17. Apparatus according to claim 16 in which said means for determining said time includes a battery for powering said printing integrator.

18. A printing integrator according to claim 17 further including means for printing a "B" when the potential of said battery drops below a predetermined level.

19. A printing integrator according to claim 16 in which said means for printing includes means for printing the integral of said input signal at predetermined periods of time and resetting said counter.

20. A printing integrator according to claim 16 in which said means for determining includes:
first pulse generator means for generating synchronizing pulses indicating each revolution of the cylinder and the particular row of the cylinder in position for printing;
second pulse generator means responsive to said synchronizing pulses for generating print pulses corresponding to each row of print; and
delay means for blocking said print pulses until said cylinder is rotating at a predetermined speed and passing said print pulses for one revolution of said cylinder after said cylinder reaches said predetermined speed.

21. A printing integrator according to claim 20 in which said delay means includes means for turning of said motor means after said one revolution.

22. A printing integrator according to claim 21 in which said first pulse generator means includes a synchronizing flip-flop means for generating at least one output pulse for each revolution of said cylinder from a first terminal and a pulse during said one revolution from a second terminal.

23. A printing integrator according to claim 22 in which said second pulse generator means includes a flip-flop.

24. A printing integrator according to claim 23 in which said delay means includes:
first delay flip-flop means connected to said first pulse generator means for generating a signal during the first revolution of said cylinder;
second delay flip-flop means connected to said first delay flip-flop means and to said first pulse generator means for generating a signal during the second revolution of said cylinder; and
gate means responsive to said signal from said second delay flip-flop means for passing pulses from said second pulse generator means.

25. A printing integrator comprising:
an input conductor adapted to carry an input signal to be integrated and to have its value printed out;
means for generating pulses related to said signal on said input conductor;
means for counting said pulses;
means for generating clock pulses;
means for storing the count from said means for counting said pulses, whereby the integral of said measured signal is stored and for storing the time of day of the counting of said pulses;
a printing cylinder including printing type;
a plurality of printing hammers;
means for actuating said printing hammers to press paper between said printing cylinder to print said type;
said means for actuating including means for printing in a single row across a sheet of paper the count of said pulses and said time of day;
motor means for turning said cylinder; and
means for determining from said information stored in said registers when said hammers are to be actuated.

* * * * *

UNITED STATES PATENT AND TRADEMARK OFFICE
CERTIFICATE OF CORRECTION

PATENT NO. : 4,169,287
DATED : September 25, 1979
INVENTOR(S) : Lyle Richard Middendorf, et al It is certified that error appears in the above-identified patent and that said Letters Patent are hereby corrected as shown below:

Column 3, line 28, after the word "to", insert a colon.
Column 14, line 56, change the word "resister" to "resistor".
Column 16, line 60, change the word "connecfted" to "connected".
Column 17, line 20, change the word "unitl" to "until".
Column 19, line 7, change the word "not" to "no".
Column 20, line 4, after the semicolon, add the word "and".

Signed and Sealed this

Eleventh Day of December 1979

[SEAL]

Attest:

SIDNEY A. DIAMOND

Attesting Officer

Commissioner of Patents and Trademarks